United States Patent
Moon (10) Patent No.: US 7,558,144 B2
(45) Date of Patent: Jul. 7, 2009

(54) CIRCUIT FOR CONTROLLING PULSE WIDTH OF AUTO-REFRESH SIGNAL AND CIRCUIT FOR GENERATING INTERNAL ROW ADDRESS FOR AUTO REFRESH

(75) Inventor: Hyung Wook Moon, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 228 days.

(21) Appl. No.: 11/648,373

(22) Filed: Dec. 28, 2006

(65) Prior Publication Data

US 2007/0159905 A1 Jul. 12, 2007

(30) Foreign Application Priority Data

Jan. 9, 2006 (KR) .................. 10-2006-0002319
Nov. 21, 2006 (KR) .................. 10-2006-0115407

(51) Int. Cl.
*G11C 8/00* (2006.01)

(52) U.S. Cl. .................. 365/230.01; 711/106
(58) Field of Classification Search .................. None
See application file for complete search history.

(56) References Cited

U.S. PATENT DOCUMENTS

| 6,728,827 | B2 | 4/2004 | Yamauchi et al. | |
| 7,206,252 | B2 * | 4/2007 | Kim | 365/230.06 |
| 7,471,589 | B2 * | 12/2008 | Kim et al. | 365/230.06 |

* cited by examiner

*Primary Examiner*—Cassandra Cox
(74) *Attorney, Agent, or Firm*—John P. White; Cooper & Dunham LLP (57) ABSTRACT

A circuit for controlling a pulse width of a refresh signal is provided. The circuit includes a first pulse width controller for receiving a first refresh signal having a first enable period, and generating a second refresh signal having a second refresh signal, and a second pulse width controller for receiving the second refresh signal, and generating a third refresh signal having a third enable period.

19 Claims, 7 Drawing Sheets

CIRCUIT FOR CONTROLLING PULSE WIDTH OF AUTO-REFRESH SIGNAL AND CIRCUIT FOR GENERATING INTERNAL ROW ADDRESS FOR AUTO REFRESH

BACKGROUND OF THE DISCLOSURE

The present disclosure relates to a circuit for controlling the pulse width of an auto-refresh signal and a circuit for generating an internal row address for auto refresh, and more particularly to circuits for controlling the pulse width of an auto-refresh signal and generating an internal row address for auto refresh, which enable auto refresh to be normally carried out in both high-speed and low-speed operations of a DRAM.

In the current information age, electronic devices are regularly used to store, process, display and otherwise output data in a form useful to us. The data can be stored in any of various structures.

For example, data can be stored, in the form of charge, in an isolated cell capacitor. Since the structure of the cell capacitor is imperfect, the stored charge may be externally leaked due to leakage current. Accordingly, it is necessary to repeatedly perform a procedure for reading the stored data before the data disappears completely, amplifying the read data, and writing the amplified data. This procedure is called a "refresh operation".

Such a refresh operation may be divided into self refresh and auto refresh. In the self refresh, all memory cells are refreshed in accordance with one command input. On the other hand, in the auto refresh, it is necessary to input a refresh command every time a refresh operation is required.

Figure 9:
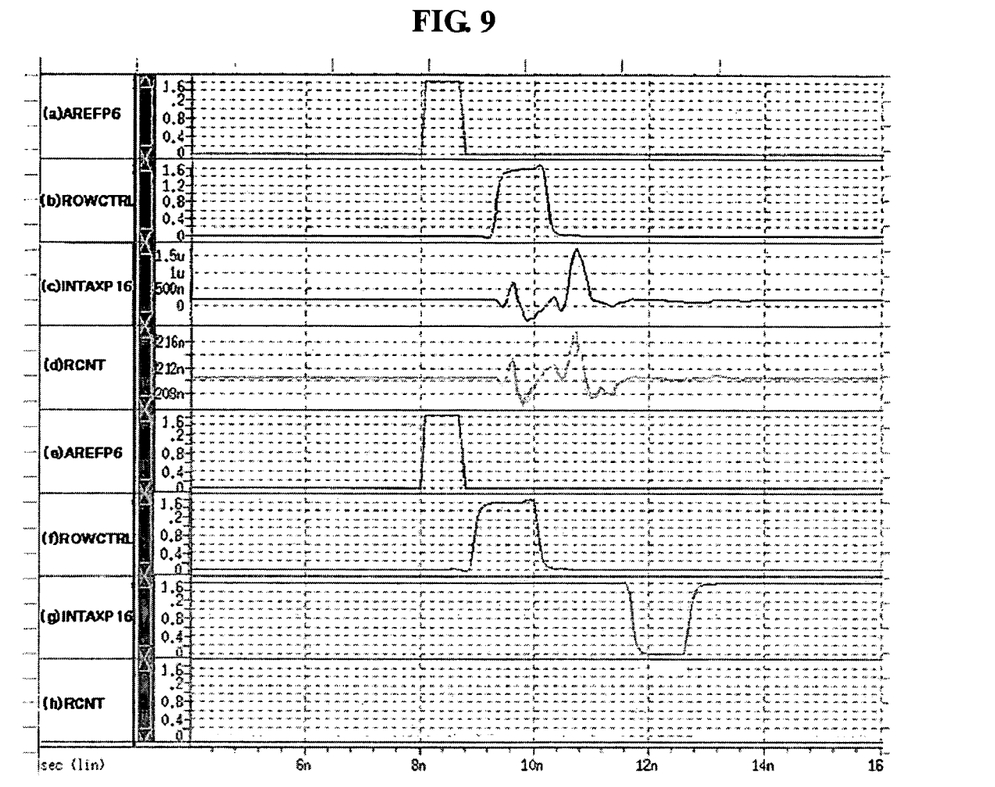
FIG. 9 is a timing diagram of internal signals in the circuit shown in FIG. 2.

An auto-refresh operation is carried out in response to an enable state of an auto-refresh signal (such as AREFP6 in FIG. 9(a)) which is enabled in accordance with a combination of a plurality of external command signals (such as cas, ras, we, and cs). However, when the enable period of the auto-refresh signal is excessively short, a flag signal (such as INTAXP16 in FIG. 9(c)) may disappear during a high-speed operation (for example, tck=1 ns or less) of a DRAM (Dynamic Random Access Memory), so that a counter enable signal (such as RCNT in FIG. 9(d)), which is abnormal, is generated.

On the other hand, when the enable period of the auto-refresh signal is excessively long, the auto-refresh signal and the counter enable signal may be simultaneously enabled during a low-speed operation (for example, tck=10 ns or more; ns=nano sec) carried out in, for example, a wafer test. In this case, there is a problem in that two different output internal row addresses GAX are output in one auto-refresh operation.

BRIEF SUMMARY OF THE DISCLOSURE

An aspect of the present disclosure is to provide a circuit for controlling a pulse width of an auto-refresh signal and a circuit for generating an internal row address for auto refresh, which are capable of adjusting an enable period of the auto-refresh signal to a predetermined enable period, thereby enabling auto refresh to be normally carried out in both high-speed and low-speed operations of a DRAM.

In one aspect of the present disclosure, a circuit for controlling a pulse width of a refresh signal comprises a first pulse width controller for receiving a first refresh signal having a first enable period and generating a second refresh signal having a second refresh signal, and a second pulse width controller for receiving the second refresh signal and generating a third refresh signal having a third enable period.

The second enable period may be longer than the first enable period.

The first pulse width controller may comprise a delay unit for delaying the first refresh signal for a predetermined period, and a first logic unit for logically operating the first refresh signal and an output signal from the delay unit, thereby generating the second refresh signal.

The delay unit may comprise a first delay unit for delaying the first refresh signal for a first delay period, a second logic unit for logically operating the first refresh signal and an output signal from the first delay unit, and a second delay unit for delaying an output signal from the second logic unit for a second delay period.

The second enable period may correspond to a sum of the first enable period, the first delay period, and the second delay period.

Each of the first and second delay units may comprise an inverter chain.

Each of the first and second logic units may perform a NANDing operation.

The second pulse width controller may comprise a delay unit for delaying the second refresh signal for a first delay period, and a logic unit for receiving the second refresh signal and an output signal from the delay unit, and logically operating the received signals.

The delay unit may comprise an inverter chain.

The logic unit may perform a NANDing operation.

In another aspect of the present disclosure, a circuit for generating an internal row address for auto refresh comprises a pulse width controller for receiving a first refresh signal having a first enable period and generating a second refresh signal having a second enable period, a decoder for generating a row address for auto refresh counted in response to a counter enable signal, and a transfer unit for transferring the row address in response to an output signal from the pulse width controller.

The pulse width controller may comprise a delay unit for delaying the first refresh signal for a predetermined period, and a logic unit for logically operating the first refresh signal and an output signal from the delay unit, thereby generating the second refresh signal.

The delay unit may comprise an inverter chain.

The logic unit may perform a NANDing operation.

The row address generating circuit may further comprise a command decoder for generating the first refresh signal in response to an external command signal, and a counter enable signal generator for receiving the second refresh signal, and generating the counter enable signal for counting of the row address required for a refresh operation.

The counter enable signal generator may comprise a row controller for receiving the second refresh signal, and generating a flag signal for enabling the counting of the row address, and a signal generator for receiving the flag signal, and generating the counter enable signal for the counting of the row address.

The second enable period may be set to enable the flag signal to be input to the signal generator.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Preferred embodiments of the present disclosure will now be described in detail with reference to the accompanying drawings. These embodiments are used only for illustrative purposes, and the present disclosure is not limited thereto.

Figure 1:
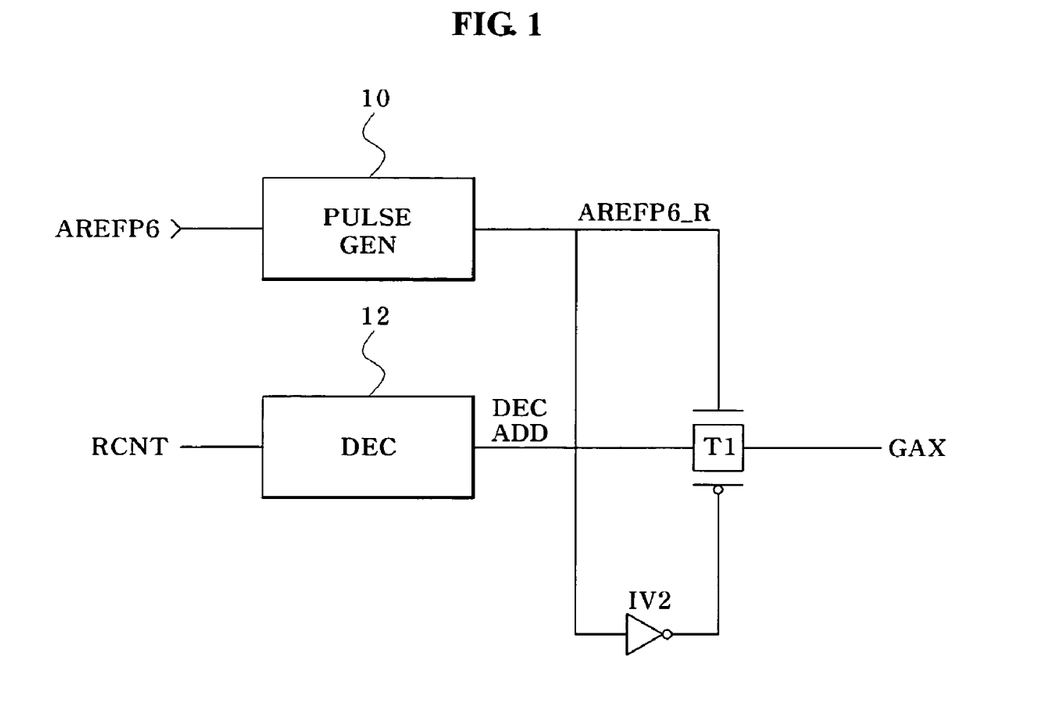
FIG. 1 is a block diagram illustrating a configuration of a circuit for generating an internal row address for auto refresh in accordance with an exemplary embodiment of the present disclosure.

FIG. 1 illustrates a configuration of a circuit for generating an internal row address for auto refresh in accordance with an exemplary embodiment of the present disclosure.

The circuit for generating an internal row address for auto refresh, in the exemplary embodiment of FIG. 1, includes a pulse width controller (PULSE GEN) 10 which receives an auto-refresh signal AREFP6, and controls an enable period of the auto-refresh signal and generates an auto-refresh signal AREFP6_R. The circuit also includes a transfer gate T1, which is turned on in response to an output signal from the pulse width controller 10 (namely, the auto-refresh signal AREFP6_R), and a decoder (DEC) 12 which generates an internal row address DEC ADD counted in response to a counter enable signal RCNT, and outputs the generated internal row address DEC ADD, as an output internal row address GAX, via the transfer gate T1.

The counter enable signal RCNT is generated from a counter enable signal generating circuit. Hereinafter, a configuration of the counter enable signal generating circuit according to an exemplary embodiment of the present disclosure will be described with reference to FIG. 2.

The counter enable signal generating circuit (designated by reference numeral 20 in FIG. 2) includes a command decoder (COMDEC) 22 for generating an auto-refresh signal AREFP6, which has a predetermined enable period, in response to external command signals (such as cas, ras, we, and cs), and a pulse width controller (PULSE GEN) 24 which receives the auto-refresh signal AREFP6, controls the enable period of the auto-refresh signal, and generates an auto-refresh signal AREFP6_R. The counter enable signal generating circuit 20 also includes a row controller (ROWCTRL) 26 which receives the auto-refresh signal AREFP6_R and generates a flag signal INTAXP16 for enabling a counting operation for the output internal row address GAX, and a signal generator (CPRCNTINIT) 28 which receives the flag signal ITAXP16, and generates the counter enable signal RCNT for counting of the output internal row address GAX. Here, the flag signal INTAXP16 is an enable signal provided for each bank, whereas the counter enable signal RCNT is provided for each block of each bank, to enable the counting operation for the output internal row address GAX.

Figure 2:
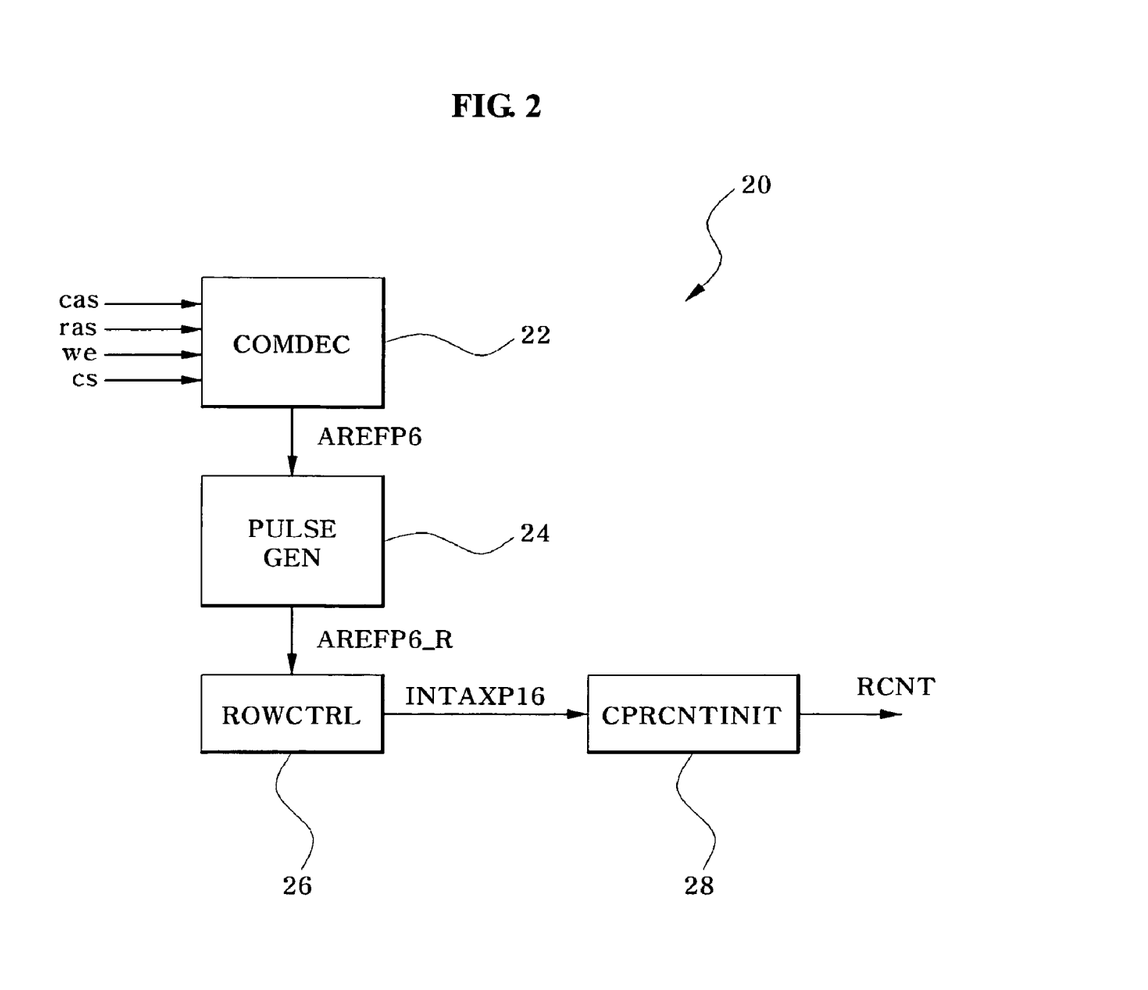
FIG. 2 is a block diagram illustrating a configuration of a counter enable signal generating circuit according to an exemplary embodiment of the present disclosure.

The pulse width controller 10 shown in FIG. 1 and the pulse width controller 24 shown in FIG. 2 may be the same constituent element, or may be respective independent constituent elements which are separate from each other. However, the pulse width controllers 10 and 24 perform the same operation. Hereinafter, the configurations and operations of these pulse width controllers will be described in detail.

Figure 3:
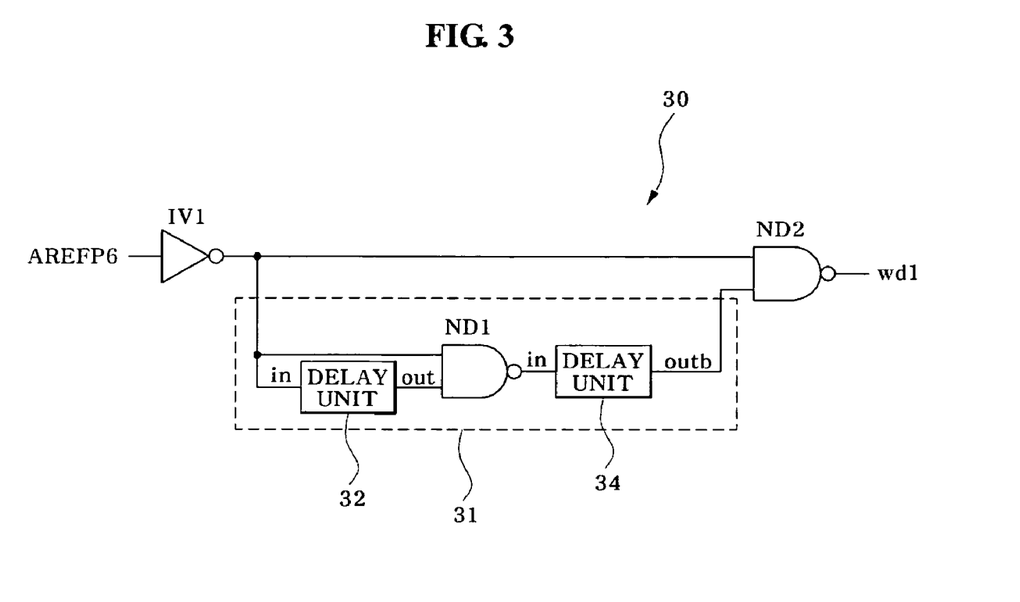
FIGS. 3 and 4 are circuit diagrams of a pulse width control circuit according to a first embodiment of the present disclosure.
Figure 4:
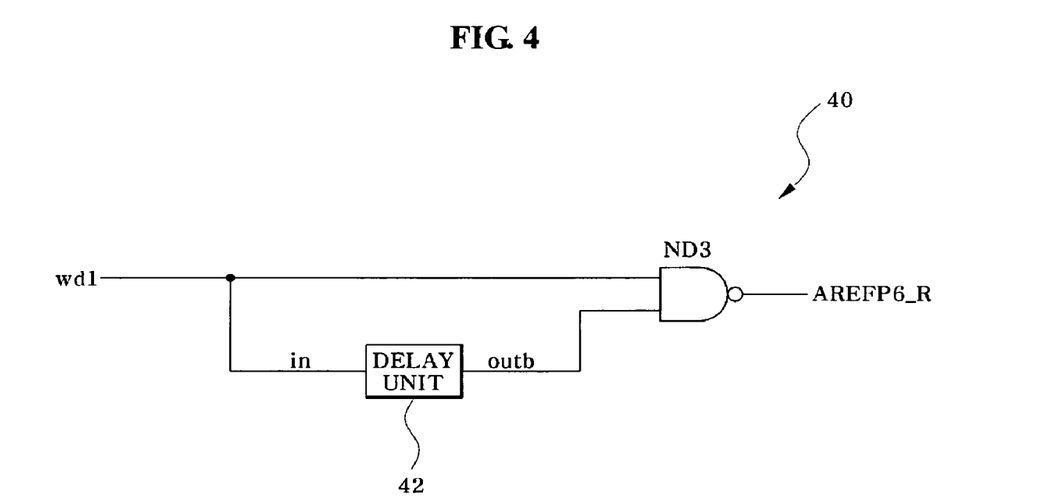

FIGS. 3 and 4 are circuit diagrams of a pulse width control circuit for an auto-refresh signal according to a first embodiment of the present disclosure.

The auto-refresh signal pulse width control circuit according to this embodiment includes a first pulse width controller 30 and a second pulse width controller 40.

As shown in FIG. 3, the first pulse width controller 30 receives the auto-refresh signal AREFP6, which is enabled in response to an auto-refresh command and has a first enable period, and generates an auto-refresh signal wd1 having a second enable period larger than the first enable period. Generally, the first enable period is ½ tck when the operation period of the associated DRAM is tck.

The first pulse width controller 30 includes an inverter IV1 for buffering the auto-refresh signal AREFP6, and a delay unit 31 for delaying an output signal from the inverter IV1 for a predetermined period. The first pulse width controller 30 also includes a NAND gate ND2 which receives the output signal from the inverter IV1, together with an output signal from the delay unit 31, performs a NANDing operation to the received signals, and outputs the resultant signal as the auto-refresh signal wd1.

The delay unit 31 includes a first delay unit 32 which receives the output signal from the inverter IV1 and outputs the received signal after delaying the received signal for a first delay period, a NAND gate ND1 which receives the output signal from the inverter IV1 and the output signal from the first delay unit 32, and performs a NANDing operation to the received signals, and a second delay unit 34 which delays an output signal from the NAND gate ND1 for a second delay period, inverts the resultant signal, and outputs the inverted signal. Here, the second enable period is set to be equal to a sum of the first and second delay periods. Each of the first and second delay units 32 and 34 includes an inverter chain. It is preferred that the first delay unit 32 includes an even number of inverters, and the second delay unit 34 includes an odd number of inverters. This is because the second delay unit 34 functions to delay an input signal in for the second delay period, invert the delayed signal, and output the inverted signal as a signal out, namely, outputs an inverted and delayed signal of the input signal in. The enable period of the auto-refresh signal AREFP6 is 400 ps or less in a high-speed operation of the DRAM corresponding to 1.2 GHz or higher. Accordingly, in order to generate an auto-refresh signal wd1 having an enable period tck corresponding to 1 ns or more (tck=1 ns or more), it is preferred that the circuit include two or more delay units, as in this embodiment.

As shown in FIG. 4, the second pulse width controller 40 receives the auto-refresh signal AREFP6, and generates an auto-refresh signal AREFP6_P having a third enable period. The second pulse width controller 40 includes a delay unit 42 which delays the auto-refresh signal wd1 for a predetermined delay period, inverts the delayed signal, and outputs the inverted signal, and a NAND gate ND3 which receives the auto-refresh signal wd1 and an output signal outb from the delay unit 42, and performs a NANDing operation to the received signals. Here, the third enable period is set to be equal to the delay period of the delay unit 42.

Operation of the auto-refresh signal pulse width control circuit having the above-described configuration according to this exemplary embodiment will be described in detail with reference to FIG. 5 which depicts a timing diagram of internal signals in the circuit.

The auto-refresh signal pulse width control circuit according to this exemplary embodiment solves problems caused by a short or long enable period of the auto-refresh signal AREFP6 by generating the auto-refresh signal AREFP6 which has a constant enable period. That is, the auto-refresh signal pulse width control circuit generates the auto-refresh signal AREFP6_R which has an enable period set to enable auto refresh to be normally carried out in both a high-speed operation (tck =1 ns) or a low-speed operation (tck=10 ns or more) of the DRAM. Hereinafter, the procedure for generating the auto-refresh signal AREFP6_R from the auto-refresh signal AREFP6 will be described in detail. The following description will be given in conjunction with, for example, the case in which the enable period tck of the auto-refresh signal AREFP6_R generated in this embodiment is adjusted to be equal to 1 ns (tck=1 ns), to solve the problems occurring in high-speed and low-speed operations of the DRAM.

First, the first pulse width controller 30 receives the auto-refresh signal AREFP6, and generates the auto-refresh signal wd1.

When it is assumed that the auto-refresh signal AREFP6 is enabled at a high level, the inverter IV1 outputs a low-level signal in response to a transition of the auto-refresh signal AREFP6 to a high level. In this state, the NAND gate ND2 outputs a high-level signal, so that the auto-refresh signal wd1 is transited to a high level. Meanwhile, the NAND gate ND1 outputs a high-level signal in which is, in turn, input to the second delay unit 34. The second delay unit 34 outputs a signal inverted from the high-level signal in after the second delay period elapses, namely, an output signal outb having a low level.

When the auto-refresh signal AREFP6 transits to a low level after elapse of the enable period thereof, a high-level signal from the inverter IV1 is input to one input terminal of each of the NAND gates ND1 and ND2. At this time, the NAND gate ND2 is in a state in which the low-level signal generated from the second delay unit 34 when the auto-refresh signal AREFP6 had a high level has been continuously input to the other input terminal of the NAND gate ND2. Accordingly, the auto-refresh signal wd1 is maintained at a high level. On the other hand, the output signal from the first delay unit 32 is input to the other input terminal of the NAND gate ND1. That is, the NAND gate ND1 receives, at the other input terminal thereof, the output signal of the inverter IV1 transited to a high level after elapse of the first delay period of the first delay unit 32. Accordingly, the NAND gate ND1 outputs a low-level signal after elapse of the first delay period. The second delay unit 34 receives, an input signal in thereof, the low-level signal output from the NAND gate ND1, and outputs a high-level signal, as an output signal outb thereof, after elapse of the second delay period. When the high-level output signal outb is input to the other input terminal of the NAND gate ND2, the NAND gate ND2 outputs a low-level signal as the auto-refresh signal wd1. Thus, the auto-refresh signal wd1 is transited to a low level after a sum of the first and second delay periods elapses from transition of the auto-refresh signal AREFP6 to a low level. Accordingly, the enable period of the auto-refresh signal wd1 is set to be equal to a sum of the enable period of the auto-refresh signal AREFP6 and the sum of the first and second delay periods. In this embodiment, the first and second delay periods are adjusted such that the enable period tck of the auto-refresh signal wd1 corresponds to 1 ns or more (tck=1 ns or more).

Subsequently, the second pulse width controller 40 receives the auto-refresh signal wd1, which has an enable period tck of 1 ns or more (tck=1 ns or more), and generates an auto-refresh signal AREFP6_R having an enable period tck of 1 ns (tck=1 ns).

Figure 5:
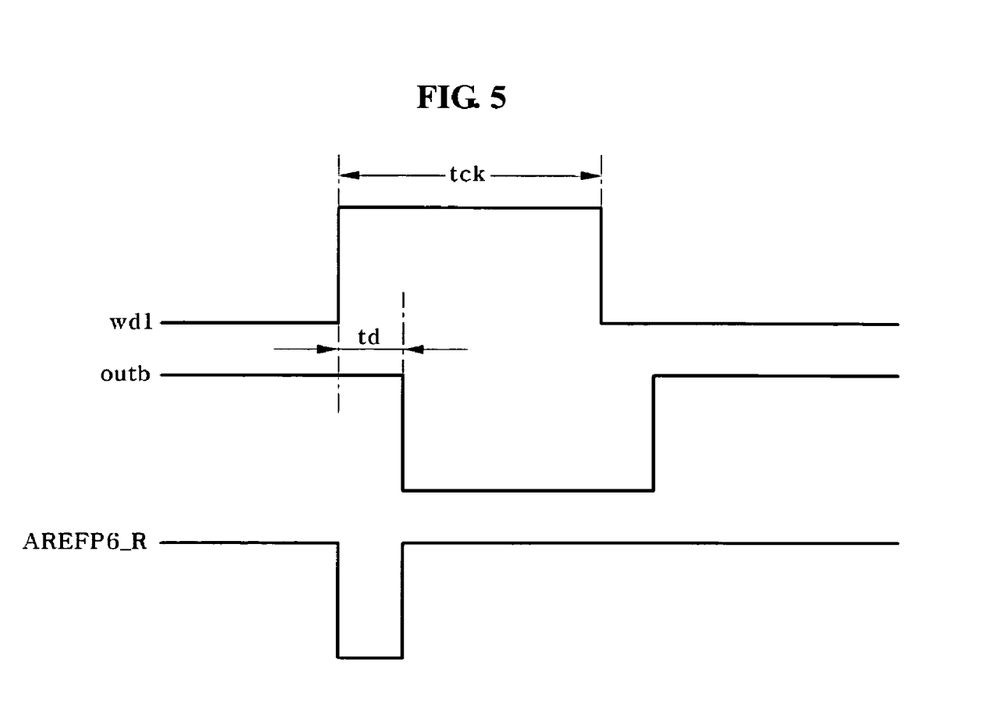
FIG. 5 is a timing diagram of internal signals in the circuit shown in FIG. 4.

As shown in FIG. 5, when the auto-refresh signal wd1 is input to the delay unit 42, as an input signal in, the delay unit 42 outputs the input auto-refresh signal wd1, as an output signal outb, after delaying the auto-refresh signal wd1 for a predetermined delay period td, and inverting the delayed signal. The NAND gate ND3 receives the auto-refresh signal wd1 and the output signal outb, and generates the auto-refresh signal AREFP6_R. Accordingly, the auto-refresh signal AREFP6_R generated from the NAND gate ND3 is maintained at a low level, namely, in an enable state, for the delay period td. That is, the enable period of the auto-refresh signal AREFP6_R is set to be equal to the delay period td of the delay unit 42, irrespective of the enable period of the auto-refresh signal wd1 input to the second pulse width controller 40. Accordingly, when the delay period td is set to 1 ns, the enable period of the auto-refresh signal AREFP6_R is set to 1 ns.

Figure 6:
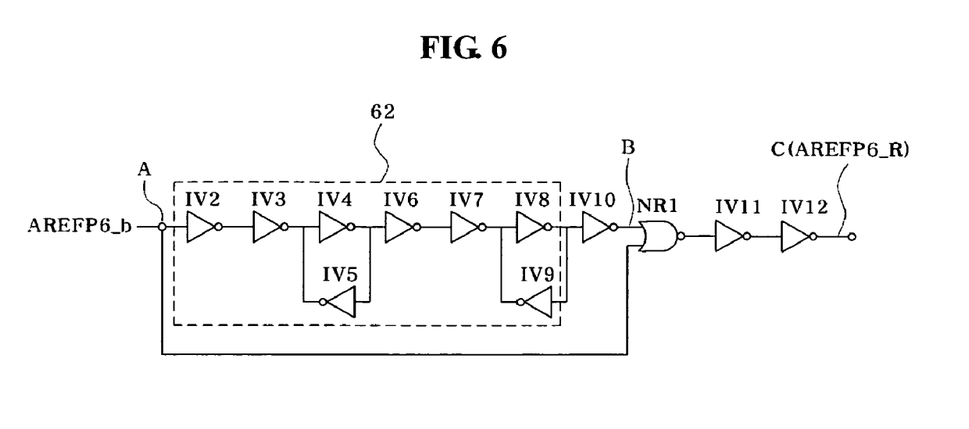
FIG. 6 is a circuit diagram of a pulse width control circuit according to a second embodiment of the present disclosure.

FIG. 6 illustrates a circuit diagram of a pulse width control circuit for an auto-refresh signal according to a second exemplary embodiment of the present disclosure.

The pulse width control circuit according to this embodiment includes a delay unit 62 which delays an inverted signal of a first refresh signal, AREFP6_b, for a predetermined period, and a NOR gate NR1 which performs a NOR operation to an output signal from an inverter IV10, which inverts an output signal from the delay unit 62, and the inverted signal of the first refresh signal, AREFP6_b. The pulse width control circuit also includes an inverter chain which buffers an output signal from the NOR gate NR1, and outputs the buffered signal as a second refresh signal AREFP6_R. In the illustrated case, the inverter chain includes inverters IV11 and IV12.

The delay unit 62 includes an inverter chain including inverters IV2 and IV3, to buffer the inverted signal of the first refresh signal, AREFP6_b, a latch including inverters IV4 and IV5, to latch an output signal from the inverter IV3, an inverter chain including inverters IV6 and IV7, to buffer an output signal from the latch, and a latch including inverters IV8 and IV9, to latch an output signal from the inverter IV7.

The pulse width control circuit having the above-described configuration according to this embodiment controls the enable period of the first refresh signal AREFP6 such that the enable period of the first refresh signal AREFP6 does not overlap with the enable period of the counter enable signal RCNT, and outputs the resultant signal as the second refresh signal AREFP6_R. The operation of the pulse width control circuit according to this embodiment will be described in detail with reference to a timing diagram of FIG. 7.

The NOR gate NR1 receives, at one input terminal thereof, the inverted signal of the first refresh signal, AREFP6_b, namely, a signal A, and receives, at the other input terminal thereof, an inverted signal of the output signal from the delay unit 62, namely, a signal B. The delay unit 62 includes a plurality of inverters IV2 to IV9 including two latches (namely, one latch including inverters IV4 and IV5, and the other latch including inverters IV8 and IV9), in order to achieve an improvement in signal driving characteristics. In accordance with this configuration, the delay unit 62 delays the inverted signal of the first refresh signal, AREFP6_b, namely, the signal A, for a delay period c. The NOR gate NR1

Figure 7:
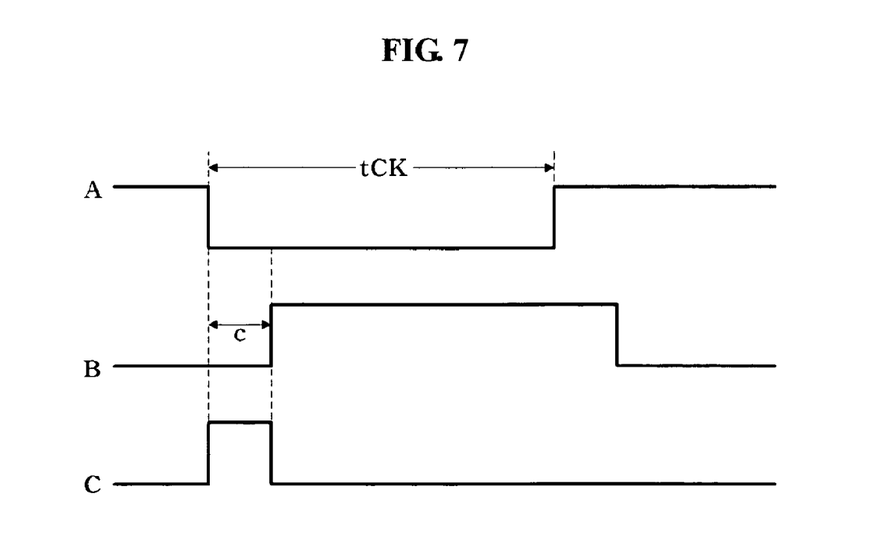
FIG. 7 is a timing diagram of internal signals in the circuit shown in FIG. 6.

NORs the inverted signal of the first refresh signal, AREFP6_b, namely, the signal A, and the inverted signal of the output signal from the delay unit 62, namely, the signal B, and outputs the resultant signal as the second refresh signal AREFP6_R, namely, a signal C. As shown in FIG. 7, the second refresh signal AREFP6_R, namely, the signal C, is maintained at a high level for the delay period c.

Thus, the pulse width control circuit according to this embodiment receives the first refresh signal AREFP6, which is enabled for a period of tCK, adjusts the enable period of the first refresh signal AREFP6, and outputs the resultant signal as the second refresh signal AREFP6_R which is enabled for the delay period c. Accordingly, the pulse width control circuit according to this embodiment prevents the enable period of the refresh signal from overlapping with the enable period of the counter enable signal RCNT by reducing the enable period of the refresh signal.

Operations of the counter enable signal generating circuit 50 and circuit for generating an internal row address for auto refresh in accordance with the above-described embodiment will be described in detail.

First, operation of the internal row address generating circuit will be described with reference to FIG. 1 and FIG. 8 which depicts a timing diagram of internal signals shown in FIG. 1.

During a low-speed operation (tck=10 ns or more) of the DRAM, the enable period of the auto-refresh signal AREFP6 is 5 ns or more. In this case, there is a phenomenon that the enable period of the auto-refresh signal AREFP6 overlaps with the enable period of the counter enable signal RCNT. When the enable period of the auto-refresh signal AREFP6 overlaps with the enable period of the counter enable signal RCNT, there is a problem in that different output internal row addresses GAX are output during one auto-refresh operation. To this end, in accordance with the illustrated embodiment of the present disclosure, an auto-refresh signal AREFP6_R having an enable period not overlapping with the enable period of the counter enable signal RCNT is generated. When an output internal row address GAX is generated based on the auto-refresh signal AREFP6_R generated as described above, there is no phenomenon that different output internal row addresses GAX are output during one auto-refresh operation.

The pulse width controller 10 can be implemented in accordance with the first exemplary embodiment of the pulse width control circuit shown in FIGS. 3 and 4 or the second exemplary embodiment of the pulse width control circuit shown in FIG. 6. For example, where the pulse width controller 10 is implemented in accordance with the first embodiment shown in FIGS. 3 and 4, it is possible to generate an auto-refresh signal AREFP6_R having an enable period reduced such that the enable period does not overlap with the enable period of the counter enable signal RCNT, by adjusting the delay period of the delay unit 42. Similarly, where the pulse width controller 10 is implemented in accordance with the first embodiment shown in FIGS. 3 and 4, it is also possible to generate an auto-refresh signal AREFP6_R having an enable period reduced such that the enable period does not overlap with the enable period of the counter enable signal RCNT, by adjusting the enable period of the auto-refresh signal AREFP6_R to correspond to the predetermined delay period of the delay unit 62 (about 1 ns).

The decoder 12 receives the counter enable signal RCNT, and generates a counted internal row address DEC ADD. That is, the decoder 12 generates the internal row address DEC ADD through a counting operation every time an enabled counter enable signal RCNT is input.

The transfer gate T1 is turned on in response to the auto-refresh signal AREFP6_R, and outputs the internal row address DEC ADD as an output internal row address GAX. That is, in accordance with the illustrated embodiment, the internal row address DEC ADD generated from the decoder 12 is output, as the output internal row address GAX, through the transfer gate T1 turned on every time the auto-refresh signal AREFP6_R is transited to a high-level, namely, an enable state.

Figure 8:
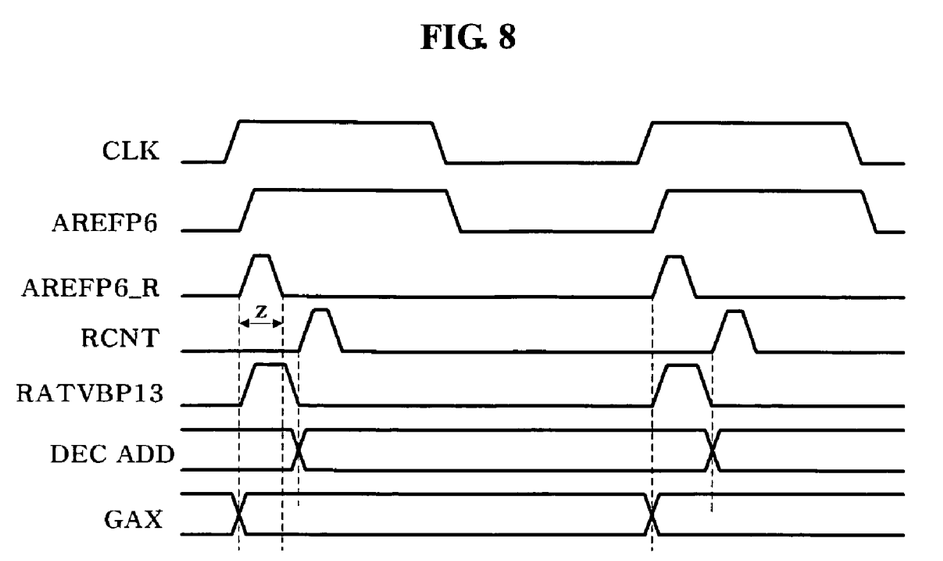
FIG. 8 is a timing diagram of internal signals in the circuit shown in FIG. 1.

As shown in FIG. 8, when the auto-refresh signal AREFP6 has a long enable period overlapping with the enable period of the counter enable signal RCNT, the pulse width controller 40 according to the illustrated embodiment generates an auto-refresh signal AREFP6_R having an enable period z not overlapping with the enable period of the counter enable signal RCNT. When an operation for generating an internal address for auto refresh is carried out using the auto-refresh signal AREFP6_R generated as described above, the operation of the decoder 12 to generate the internal row address DEC ADD counted in response to the counter enable signal RCNT input to the decoder 12 and the operation for transferring the internal row address DEC ADD as the output internal row address GAX are separately carried out. Accordingly, there is no phenomenon that two different output internal row addresses GAX are generated and output during one auto-refresh operation.

Next, operation of the counter enable signal generating circuit 20 will be described with reference to FIG. 2 and FIG. 9 which depicts a timing diagram of internal signals shown in FIG. 2. The following description will be provided in conjunction with the case in which it is assumed that the DRAM operates at a high speed (tck=1 ns).

The command decoder 22, which receives external command signals cas, ras, we, and cs, generates an auto-refresh signal AREFP6 having an enable period of 0.5 ns (½ tck). The row controller 26 receives the auto-refresh signal AREFP6, and generates a flag signal INTAXP16. The signal generator 28 receives the flag signal INTAXP16, and generates a counter enable signal RCNT. In this case, there is an asynchronous delay of about 2 ns between the auto-refresh signal AREFP6 and the counter enable signal RCNT. For this reason, when the counter enable signal RCNT is generated, based on an auto-refresh signal AREFP6 having a short enable period, the flag signal INTAXP16 may disappear before being input to the signal generator 28. In this case, there is a problem in that the signal generator 28 may generate an abnormal counter enable signal RCNT ("d" in FIG. 9). To this end, in accordance with the illustrated embodiment, the pulse width controller 24 is provided to generate the auto-refresh signal AREFP6_R which has an enable period increased to prevent the flag signal INTAXP16 from disappearing before being input to the signal generator 28.

It is preferred that the pulse width controller 24 be implemented in accordance with the first embodiment of the pulse width control circuit shown in FIGS. 3 and 4. In this case, it is possible to effectively generate an auto-refresh signal AREFP6_R having an enable period increased to prevent the flag signal INTAXP16 from disappearing before being input to the signal generator 28 by adjusting the delay periods of the delay units 32 and 34 included in the first pulse width controller 30 and the delay period of the delay unit 42 included in the second pulse width controller 40.

Referring to FIG. 9, it can be seen that, when a counter enable signal RCNT is generated based on an auto-refresh signal AREFP6 ("a" in FIG. 9) having an enable period of 0.5 ns, the generated counter enable signal RCNT is abnormal ("d" in FIG. 9) because the flag signal INTAXPL6 ("c" in FIG. 9) may disappear before being input to the signal generator 28. On the other hand, it can be seen that, when a counter enable signal RCNT is generated based on an auto-refresh signal AREFP6_R generated in accordance with the illustrated embodiment, the generated counter enable signal RCNT is normal ("h" in FIG. 9) because the flag signal INTAXP16 ("g" in FIG. 9) does not disappear before being input to the signal generator 28.

Although the preferred embodiments of the disclosure have been disclosed for illustrative purposes, those skilled in the art will appreciate that various modifications, additions and substitutions are possible, without departing from the scope and spirit of the disclosure as disclosed in the accompanying claims. For example, the above-described circuits for controlling the pulse width of an auto-refresh signal and generating an internal row address for auto refresh in accordance with the present disclosure can also be applied to various internal signal generating circuits required for generation of a signal having a certain enable period.

As apparent from the above description, in accordance with the present disclosure, it is possible to enable auto refresh to be normally carried out in both high-speed and low-speed operations of a DRAM by adjusting the enable period of an auto-refresh signal to a predetermined enable period.

The present application claims priority to Korean patent application number 10-2006-2319, filed on Jan. 9, 2006, and to Korean patent application no. 10-2006-115407, filed on Nov. 21, 2006, the entire contents of each of which are incorporated by reference herein.

What is claimed is:

1. A circuit for generating an internal row address for auto refresh, comprising:
   a pulse width controller configured to receive a first refresh signal having a first enable period, and generate a second refresh signal having a second enable period;
   a decoder configured to generate a row address for auto refresh counted in response to a counter enable signal; and
   a transfer unit configured to transfer the row address in response to an output signal from the pulse width controller.

2. The circuit according to claim 1, wherein the second enable period of the second refresh signal does not overlap with an enable period of the counter enable signal.

3. The circuit according to claim 1, wherein the pulse width controller comprises:
   a first pulse width controller configured to receive the first refresh signal having the first enable period, and generate the second refresh signal having the second refresh signal; and
   a second pulse width controller configured to receive the second refresh signal, and generate a third refresh signal having a third enable period.

4. The circuit according to claim 3, wherein the second enable period is longer than the first enable period.

5. The circuit according to claim 3, wherein the first pulse width controller comprises:
   a delay unit configured to delay the first refresh signal for a predetermined period; and
   a first logic unit configured to perform a logical operation to the first refresh signal and an output signal from the delay unit, thereby generating the second refresh signal.

6. The circuit according to claim 5, wherein the delay unit comprises:
   a first delay unit configured to delay the first refresh signal for a first delay period;
   a second logic unit configured to perform a logical operation to the first refresh signal and an output signal from the first delay unit; and
   a second delay unit configured to delay an output signal from the second logic unit for a second delay period.

7. The circuit according to claim 6, wherein the second enable period corresponds to a sum of the first enable period, the first delay period, and the second delay period.

8. The circuit according to claim 6, wherein each of the first and second delay units comprises an inverter chain.

9. The circuit according to claim 6, wherein each of the first and second logic units performs a NAND operation.

10. The circuit according to claim 3, wherein the second pulse width controller comprises:
    a delay unit configured to delay the second refresh signal for a first delay period; and
    a logic unit configured to receive the second refresh signal and an output signal from the delay unit, and perform a logical operation to the received signals.

11. The circuit according to claim 10, wherein the delay unit comprises an inverter chain.

12. The circuit according to claim 10, wherein the logic unit performs a NAND operation.

13. The circuit according to claim 1, wherein the pulse width controller comprises:
    a delay unit configured to delay the first refresh signal for a predetermined period; and
    a logic unit configured to perform a logical operation to the first refresh signal and an output signal from the delay unit, thereby generating the second refresh signal.

14. The circuit according to claim 13, wherein the delay unit comprises an inverter chain.

15. The circuit according to claim 13, wherein the logic unit performs a NAND operation.

16. The circuit according to claim 1, further comprising:
    a command decoder configured to generate the first refresh signal in response to an external command signal; and
    a counter enable signal generator configured to receive the second refresh signal, and generate the counter enable signal for counting of the row address required for a refresh operation.

17. The circuit according to claim 16, wherein the counter enable signal generator comprises:
    a row controller configured to receive the second refresh signal, and generate a flag signal for enabling the counting of the row address; and
    a signal generator configured to receive the flag signal, and generate the counter enable signal for the counting of the row address.

18. The circuit according to claim 17, wherein the second enable period is set to enable the flag signal to be input to the signal generator.

19. The circuit according to claim 17, wherein the second enable period of the second refresh signal does not overlap with an enable period of the counter enable signal.

* * * * *